United States Patent
Juang

[11] Patent Number: 5,917,378
[45] Date of Patent: Jun. 29, 1999

[54] RAIL-TO-RAIL TYPE OF OPERATIONAL AMPLIFIER WITH A LOW OFFSET VOLTAGE ACHIEVED BY MIXED COMPENSATION

[75] Inventor: Dar-Chang Juang, Hsinchu, Taiwan

[73] Assignee: Industrial Technology Research Institute, Taiwan

[21] Appl. No.: 08/883,958

[22] Filed: Jun. 27, 1997

[51] Int. Cl.[6] .................................................. H03F 3/45
[52] U.S. Cl. ........................ 330/253; 330/255; 330/260
[58] Field of Search ................................ 330/252, 253, 330/255, 258, 260

[56] References Cited

U.S. PATENT DOCUMENTS 4,918,398   4/1990   Huijsing et al. ..................... 330/258 X

*Primary Examiner*—James B. Mullins
*Attorney, Agent, or Firm*—Finnegan, Henderson, Farabow, Garrett & Dunner, L.L.P.

[57] ABSTRACT

A rail-to-rail type of operational amplifier is provided, which has a low offset voltage and improved bandwidth, slew rate, and phase margin. This operational amplifier includes two level-shifting input circuits for receiving two input voltages. The input voltages are further divided into four subvoltages which are then processed by a pair of differential amplifiers. The output differential currents from the differential amplifiers are further processed respectively by two current-summing circuits. The potential difference between the outputs of these two current-summing circuits is then fed to a bias circuit which, in response to the input potential difference, generates a floating bias. An output circuit takes the floating bias as input to thereby generate an output voltage which is regarded as the output of the operational amplifier. In addition to two cascaded-Miller compensation circuits, two mixed compensation circuits are used to perform a compensation on the output voltage and feed the compensated voltage back to the differential amplifiers. This allows the offset voltage to be subject to minimum fluctuations. Moreover, it allows improved bandwidth with increased unit gain as well as improved slew rate and phase margin.

12 Claims, 3 Drawing Sheets

RAIL-TO-RAIL TYPE OF OPERATIONAL AMPLIFIER WITH A LOW OFFSET VOLTAGE ACHIEVED BY MIXED COMPENSATION

BACKGROUND OF THE INVENTION

1. Field of the Invention

This invention relates to operational amplifiers, and more particularly, to a rail-to-rail type of operational amplifier based on a common-source amplifier which is devised in such a manner as to allow a low offset voltage and an improved bandwidth, slew rate, and phase margin.

2. Description of Related Art

A conventional rail-to-rail type of input/output (I/O) operational amplifier is composed of a CMOS (complementary metal-oxide semiconductor) transistor, a common-source amplifier, a current-summing amplifier, and an AB-class output stage. The common-source amplifier has a threshold voltage equal to $V_{gs}+V_{sat}$, where $V_{gs}$ is the potential difference between gate and source, and $V_{sat}$ is the saturation voltage of the transistor. Therefore, when the common-mode input voltages reach a level nearly equal to the source DC bias $V_{SS}$ or the drain DC bias $V_{DD}$, the operational amplifier will be subjected to a current transient that causes an increase in the input DC offset voltage, thereby affecting the performance of the operational amplifier. This drawback will be described in more detail in the following with reference to FIG. 1.

FIG. 1 is a schematic circuit diagram of a conventional rail-to-rail type of operational amplifier. This operational amplifier includes two sets of common-source differential input units for receiving two input voltages $V_i^+$; and $V_i^-$, one input unit consisting of a pair of NMOS transistors 105, 106 and the other consisting of a pair of PMOS transistors 107, 108. The gate of the NMOS transistor 105 and the gate of the PMOS transistor 107 are connected to a common node which is connected to the first input voltage $V_i^+$; and in a similar manner, the gate of the NMOS transistor 106 and the gate of the PMOS transistor 108 are connected to a common node which is connected to the second input voltage $V_i^-$. The drain of the NMOS transistor 105 outputs a differential current $\Delta i_{11}^+$, while the drain of the NMOS transistor 106 outputs a differential current $\Delta i_{11}^-$. These two differential currents $\Delta i_{11}^+$ and $\Delta i_{11}^-$ are fed together to a first current-summing circuit 10 to be summed therein. Similarly, the drain of the PMOS transistor 107 outputs a differential current $\Delta i_{12}^+$, while the drain of the PMOS transistor 108 outputs a differential output current $\Delta i_{11}^-$. These two differential output currents $\Delta i_{12}^+$ and $\Delta i_{l2}^-$ are fed to a second current-summing circuit 12 to be summed therein. The potential difference between the output of the first current-summing circuit 10 and the output of the second current-summing circuit 12, as designated by V1, is fed to a buffer circuit 14. The output of the buffer circuit 14 is coupled to an AB-class output circuit consisting of a PMOS transistor 134 and an NMOS transistor 135. In response to the output of the buffer circuit 14, the AB-class output circuit will produce an output voltage $V_{o1}$ which is taken as the output of the operational amplifier. The buffer circuit 14 uses a source follower for the biasing so as to increase the input impedance thereof. The AB-class output circuit acts as a buffer amplifier with one unit gain.

In the foregoing operational amplifier, if the DC bias for the differential currents $\Delta i_{12}^+$ and $\Delta i_{12}^-$ causes the generation of $I_2=2 \mu A$ (micro-ampere), the sum of the two current $I_1+I_2$ should be raised to about 20 $\mu A$ in order to keep the variation of the potential difference V1 that is affected by the offset voltage to less than 10%. In this case, the DC bias for the differential currents $\Delta i_{11}^+$ and $\Delta i_{11}^-$ should cause the generation of $I_1=18 \mu A$. Further, when the common-mode input voltages $V_i^+$, $V_i^-$ are raised to a level nearly equal to the drain DC bias $V_{DD}$, the PMOS transistors 107, 108 will be switched OFF, causing the differential currents $\Delta i_{12}^+$ and $\Delta i_{l2}^-$ to disappear and thus the potential difference V1 to rise. This in turn causes the offset voltage to increase. On the other hand, when the common-mode input voltages $V_i^+$, $V_i^-$ are lowered to a level nearly equal to the source DC bias $V_{SS}$, the NMOS transistors 105, 106 will be switched OFF. This causes the circuit to lose the capability to maintain the offset voltage within the desired range.

SUMMARY OF THE INVENTION

It is therefore a primary objective of the present invention to provide a rail-to-rail type of operational amplifier in which the foregoing drawbacks of the prior art are not experienced so that the operational amplifier always has a low offset voltage and an improved bandwidth, slew rate, and phase margin.

In accordance with the foregoing and other objectives of the present invention, an improved rail-to-rail type of operational amplifier is provided. This operational amplifier includes the following circuit elements:

(a) a first level-shifting input circuit, receiving the first input voltage, for dividing the first input voltage into a first subvoltage and a second subvoltage;

(b) a second level-shifting input circuit, receiving the second input voltage, for dividing the second input voltage into a third subvoltage and a fourth subvoltage;

(c) a first differential amplifier having a positive input end coupled to receive the first subvoltage from the first level-shifting input circuit and a negative input end coupled to receive the third subvoltage from the second level-shifting input circuit, the first differential amplifier generating a first differential current and a second differential current in response to the first and third subvoltage;

(d) a second differential amplifier having a positive input end coupled to receive the second subvoltage from the first level-shifting input circuit and a negative input end coupled to receive the fourth subvoltage from the second level-shifting input circuit, the second differential amplifier generating a third differential current and a fourth differential current in response to the second and fourth subvoltage;

(e) a first current-summing circuit for summing the first differential current and the second differential current from the first differential amplifier to thereby generate a first output potential;

(f) a second current-summing circuit for summing the third differential current and the fourth differential current from the second differential amplifier to thereby generate a second output potential;

(g) a bias circuit, taking the difference between the first output potential from the first current-summing circuit and the second output potential from the second current-summing circuit as input, for generating a bias voltage;

(h) an output circuit, coupled to the bias circuit, for generating the output voltage of the operational amplifier;

(i) a first compensation circuit for performing a cascaded-Miller compensation on the output voltage of the operational amplifier and then feeding back the compensated voltage to the first differential current;

(j) a second compensation circuit for performing a cascaded-Miller compensation on the output voltage of the operational amplifier and then feeding back the compensated voltage to the fourth differential current;

(k) a third compensation circuit for performing a mixed compensation on the output voltage of the operational amplifier and then feeding back the compensated voltage to the negative input of the first differential amplifier; and (l) a fourth compensation circuit for performing a mixed compensation on the output voltage of the operational amplifier and then feeding back the compensated voltage to the negative input of the second differential amplifier.

The incorporation of the level-shifting circuit in the operational amplifier allows the common-source amplifier that serves as a differential amplifier to be always maintained within the active region. This allows the bias for the operational amplifier to be maintained at a constant and the offset voltage to be subject to minimum fluctuations. Furthermore, the incorporation of the mixed compensation feedback circuits, i.e., the third compensation circuit and the fourth compensation circuit, can achieve the negative zero point that allows for improved bandwidth with increased unit gain and improved slew rate and phase margin.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1:
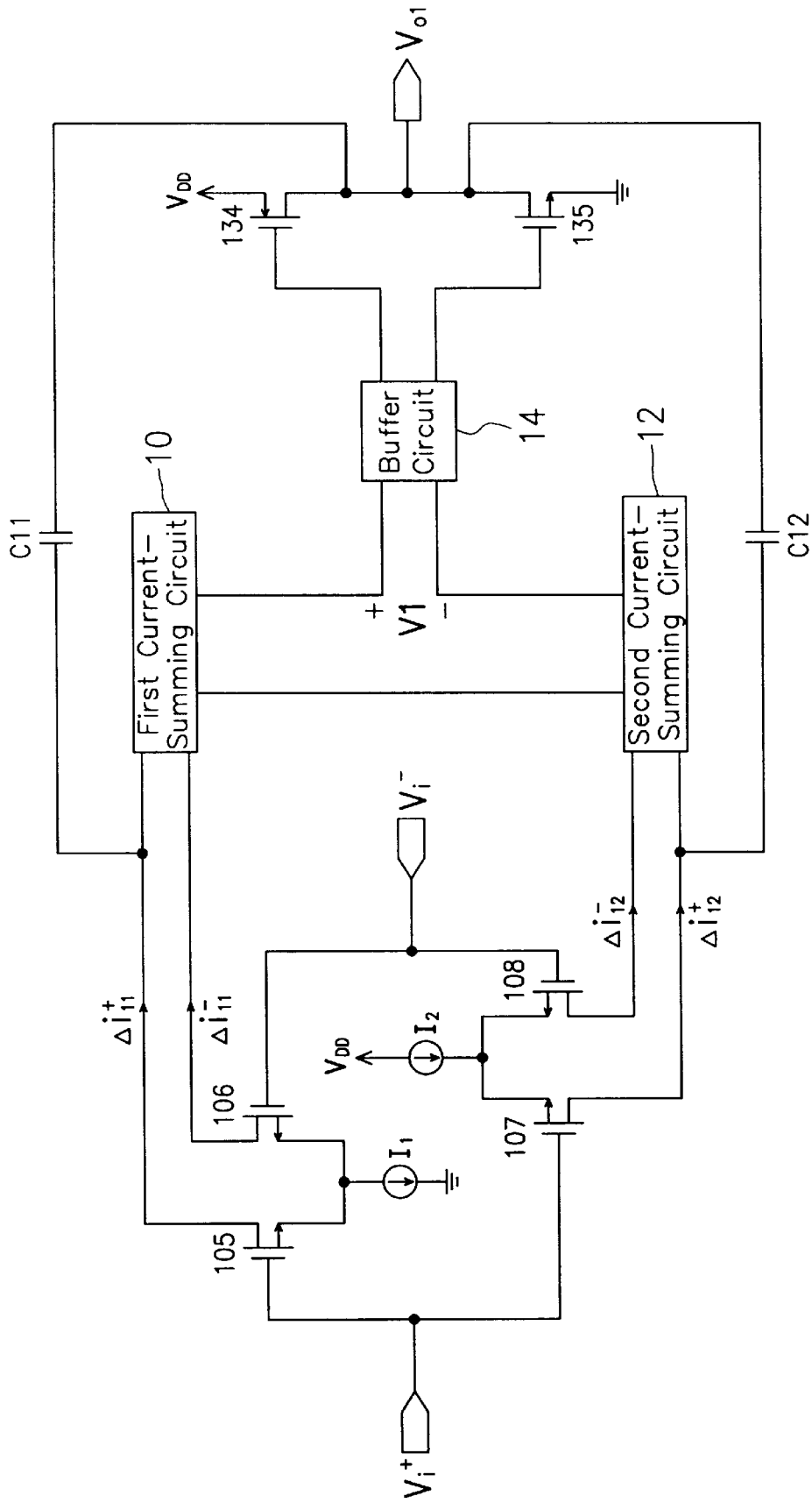
FIG. 1 is a schematic circuit diagram of a conventional rail-to-rail type of operational amplifier.
Figure 2:
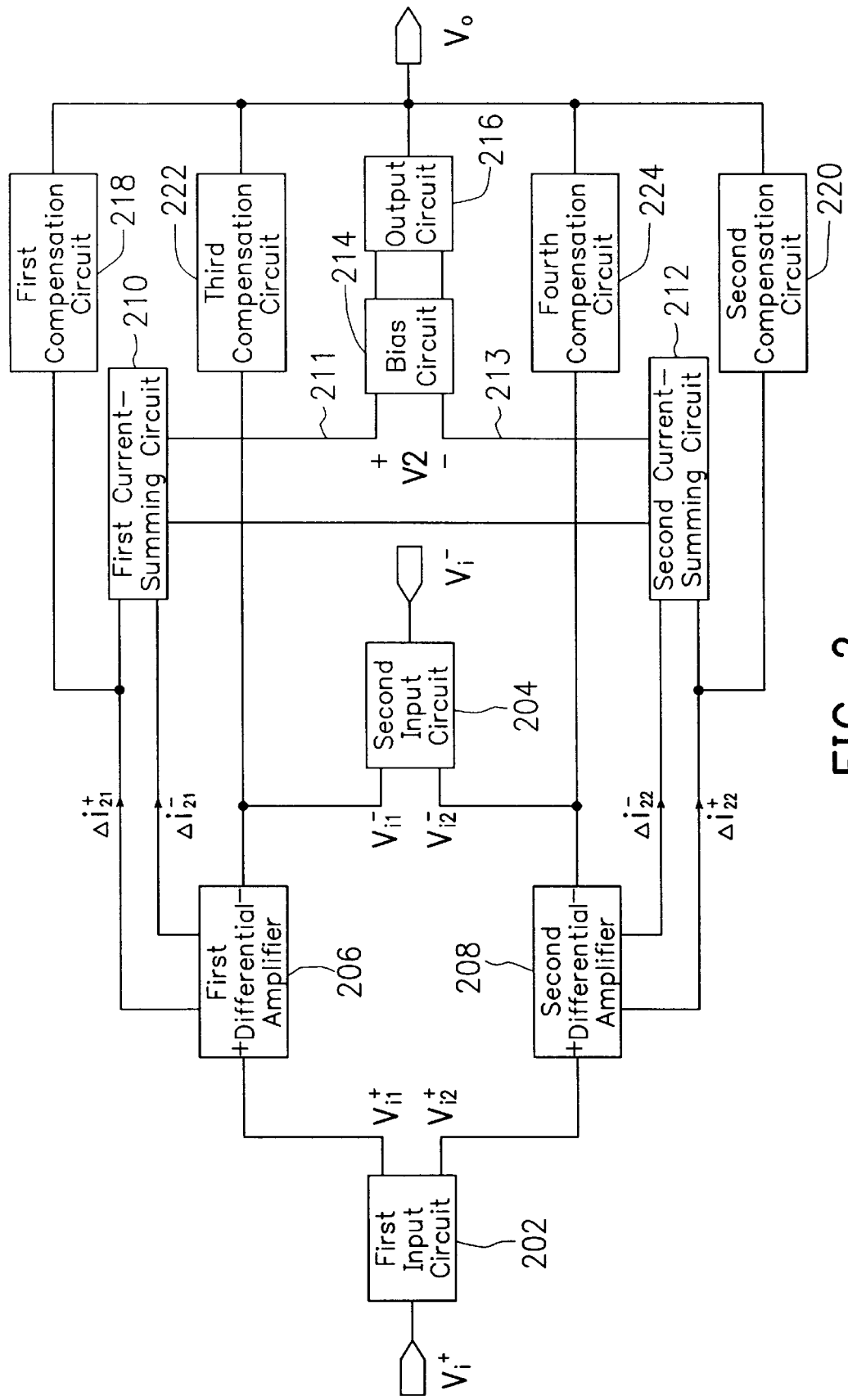
FIG. 2 is a schematic block diagram of a rail-to-rail type of operational amplifier according to the invention.

FIG. 2 is a schematic block diagram of the rail-to-rail type of operational amplifier according to the invention. This operational amplifier can produce an output $V_o$ in response to two input voltages $V_i^+$ and $V_i^-$ that are respectively received via a first input circuit 202 and a second input circuit 204.

The first input circuit 202 divides the first input voltage $V_i^+$ into two subvoltages $V_{i1}^+$ and $V_{i2}^+$. The subvoltage $V_{i1}^+$ is fed to the positive input of a first differential amplifier 206, while the other subvoltage $V_{i2}^+$ is fed to the positive input of a second differential amplifier 208. Similarly, the second input circuit 204 divides the second input voltage $V_i^-$ into two subvoltages $V_{i1}^-$ and $V_{i2}^-$. The subvoltage $V_{i1}^-$ is fed to the negative input of the first differential amplifier 206, while the other subvoltage $V_{i2}^-$ is fed to the negative input of the second differential amplifier 208.

In response to the inputs $V_{i1}^+$ and $V_{i1}^-$, the first differential amplifier 206 outputs two differential currents $\Delta i_{21}^+$ and $\Delta i_{21}^-$ which are then transferred to a first current-summing circuit 210 to be summed therein; and similarly, in response to the inputs $V_{i2}^+$ and $V_{i2}^-$, the second differential amplifier 208 outputs two differential currents $\Delta i_{22}^+$ and $\Delta i_{22}^-$ which are then transferred to a second current-summing circuit 212 to be summed therein. The first and second current-summing circuit 210, 212 are coupled in such a manner that the output of the first current-summing circuit 210 is emitted via a wire 211, while the output of the second current-summing circuit 212 is emitted via a wire 213; and the potential difference, as designated by V2, between the two wires 211, 213 is fed to a bias circuit 214.

The output of the bias circuit 214 is coupled to an output circuit 216. In response to the output of the bias circuit 214, the output circuit 216 will generate an output voltage $V_o$ which is regarded as the output of the operational amplifier. This output voltage $V_o$ is fed back to the previous stages via four compensation circuits: a first compensation circuit 218 whose output is added to the differential current $\Delta i_{21}^+$; a second compensation circuit 220 whose output is added to the differential current $\Delta i_{22}^+$; a third compensation circuit 222 whose Output is connected to the negative input of the first differential amplifier 206; and a fourth compensation circuit 224 whose output is connected to the negative input of the second differential amplifier 208. The structure and functionality of these compensation circuits will be described later.

Figure 3:
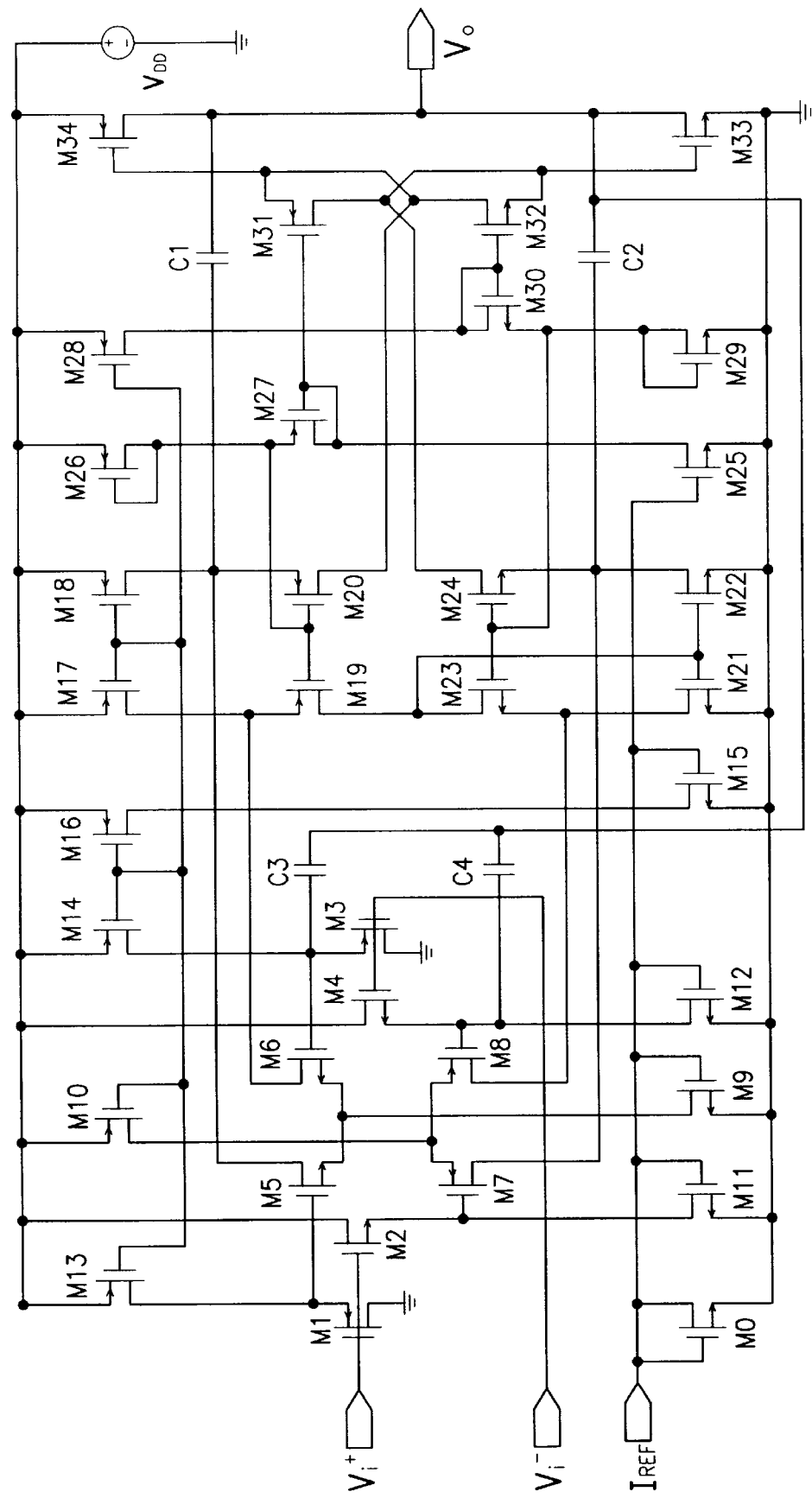
FIG. 3 is a detailed circuit diagram of the operational amplifier of FIG. 2.

FIG. 3 is a detailed circuit diagram of the operational amplifier of FIG. 2. As shown, the first input circuit 202 is a level-shifter based on a source follower composed of a PMOS transistor M1 and an NMOS transistor M2; and similarly, the second input circuit 204 is a level-shifter based on a source follower composed of a PMOS transistor M3 and an NMOS transistor M4. The body of the PMOS transistor M1 and the body of the PMOS transistor M3 are both coupled to the drain DC bias $V_{DD}$; while the body of the NMOS transistor M2 and the body of the NMOS transistor M4 are both coupled to the source DC bias $V_{SS}$.

The first differential amplifier 206 is a common-source differential amplifier composed of a pair of NMOS transistors M5, M6; while the second differential amplifier 208 is a common-source differential amplifier composed of a pair of PMOS transistors M7, M8. The first current-summing circuit 210 is a summing amplifier composed of a pair of PMOS transistors M19, M20; the second current-summing circuit 212 is also a summing amplifier composed of a pair of NMOS transistors M23, M24. The bias circuit 214 is composed of a pair of PMOS transistors M27, M31 and a pair of NMOS transistors M30, M32. This allows the bias circuit 214 to produce a floating bias. The output circuit 216 is an AB-class output circuit comprise of a pair of CMOS transistors M33, M34.

The first compensation circuit 218 is a feedback circuit composed of one single capacitor C1; the second compensation circuit 220 is a feedback circuit composed of one single capacitor C2; the third compensation circuit 222 is a negative-zero feedback circuit composed of one single capacitor C3; and the fourth compensation circuit 224 is also a negative-zero feedback circuit composed of one single capacitor C4.

Referring also to FIG. 2, the first and second input circuits 202, 204 both have level-shifting capability. Therefore, although the common-mode input voltages may fluctuate to a level nearly equal of the source DC bias $V_{SS}$ or the drain DC bias $V_{DD}$, the input bias for the first and second differential amplifiers 206, 208 can nonetheless be maintained within the active region.

For example, when the input voltage $V_i^+$ or $V_i^-$ raises to a level nearly equal to the drain DC bias $V_{DD}$, the PMOS transistor M1 or M3 are switched OFF, but the NMOS transistors MS, M6 remain in the ON state. As a result, the NMOS transistors M2, M4 are switched ON. However, due to the body effect which causes the threshold voltage to be large, the PMOS transistors M7, M8 are not switched OFF and remain in the ON state.

On the other hand, when the input voltage $V_i^+$ or $V_i^-$ drops to a level nearly equal to the source DC bias $V_{SS}$, the PMOS transistors M1 and M3 are both switched ON. However, due to the body effect which causes the threshold voltage to be large, the NMOS transistors M5, M6 are not switched OFF and remain in the ON state. The NMOS transistor M2 or M4 are switched OFF, while the PMOS transistors M7, M8 remain in the ON state.

Therefore, by means of the level-shifting capability of the first and second input circuits 202, 204, the transistors M5, M6, M7, M8 are not switched OFF no matter how the input voltage $V_i^+$ or $V_i^-$ fluctuates. The potential difference V2 between the output of the first current-summing circuit 210 and the output of the second current-summing circuit 212 can thus be maintained at a constant level, allowing the fluctuations in the offset voltage to be negligibly small relative to the common-mode input voltages.

Referring to FIG. 2 together with FIG. 3, the first compensation circuit (capacitor C1) 218 connected to the first current-summing circuit 210 and the second compensation circuit (the capacitor C2) 220 connected to the second current-summing circuit 212 are both based on the conventional cascaded-Miller compensation which allows increased bandwidth and phase margin. However, since a small amount of feed-forward current occurs in this circuit, a positive zero point will appear near the point of unit gain, which causes a decrease in the bandwidth and phase margin. Accordingly, the invention proposes a mixed compensation method, in which the third compensation circuit (the capacitor C3) 222 and the fourth compensation circuit (the capacitor C4) 224 are negative-zero feedback circuits that are coupled in conjunction with the second input circuit 204 to the first and second differential amplifiers 206, 208 respectively, for preventing the appearance of the positive zero due to the use of the cascaded-Miller compensation circuits (i.e., the first and second compensation circuits 218, 220) in the operational amplifier that would otherwise cause a decrease in the phase margin. The invention thus allows the operational amplifier to have an improved bandwidth with increased unit gain and also improved slew rate and phase margin.

In conclusion, the invention has several advantages over the prior art. First, the incorporation of the level-shifting circuit in the operational amplifier allows the common-source amplifier that serves as a differential amplifier to be always maintained within the active region. This allows the bias for the operational amplifier to be maintained at a constant and the offset voltage to be subject to minimum fluctuations.

Second, the incorporation of the mixed compensation feedback circuits, i.e., the third compensation circuit 222 and the fourth compensation circuit 224, can achieve the negative zero point that allows for improved bandwidth with increased unit gain and improved slew rate and phase margin.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An operational amplifier for generating an output in response to a first input voltage and a second input voltage, comprising:

a first level-shifting input circuit, receiving said first input voltage, for dividing said first input voltage into a first subvoltage and a second subvoltage;

a second level-shifting input circuit, receiving said second input voltage, for dividing said second input voltage into a third subvoltage and a fourth subvoltage;

a first differential amplifier having a positive input end coupled to receive said first subvoltage from said first level-shifting input circuit and a negative input end coupled to receive said third subvoltage from said second level-shifting input circuit, said first differential amplifier generating a first differential current and a second differential current in response to said first and third subvoltages;

a second differential amplifier having a positive input end coupled to receive said second subvoltage from said first level-shifting input circuit and a negative input end coupled to receive said fourth subvoltage from said second level-shifting input circuit, said second differential amplifier generating a third differential current and a fourth differential current in response to said second and fourth subvoltages;

a first current-summing circuit for summing said first differential current and said second differential current from said first differential amplifier to thereby generate a first output potential;

a second current-summing circuit for summing said third differential current and said fourth differential current from said second differential amplifier to thereby generate a second output potential;

a bias circuit, taking the difference between said first output potential from said first current-summing circuit and said second output potential from said second current-summing circuit as input, for generating a bias voltage;

an output circuit, coupled to said bias circuit, for generating the output voltage of said operational amplifier;

a first compensation circuit for performing a cascaded-Miller compensation on the output voltage of said operational amplifier and then feeding back the compensated voltage to said first differential current;

a second compensation circuit for performing a cascaded-Miller compensation on the output voltage of said operational amplifier and then feeding back the compensated voltage to said fourth differential current;

a third compensation circuit for performing a mixed compensation on the output voltage of said operational amplifier and then feeding back the compensated voltage to the negative input of said first differential amplifier; and a fourth compensation circuit for performing a mixed compensation on the output voltage of said operational amplifier and then feeding back the compensated voltage to the negative input of said second differential amplifier.

2. The operational amplifier of claim 1, wherein said first input circuit includes a PMOS transistor and an NMOS transistor coupled to said PMOS transistor.

3. The operational amplifier of claim 1, wherein said second input circuit includes a PMOS transistor and a NMOS transistor coupled to said PMOS transistor.

4. The operational amplifier of claim 1, wherein first differential amplifier includes a pair of NMOS transistors.

5. The operational amplifier of claim 1, wherein said second differential amplifier includes a pair of PMOS transistors.

6. The operational amplifier of claim 1, wherein one of said first and second current-summing circuits is composed of a pair of PMOS transistors, and the other of said first and second current-summing circuits is composed of a pair of NMOS transistors.

7. The operational amplifier of claim 1, wherein said bias circuit outputs a floating bias to said output circuit.

8. The operational amplifier of claim 1, wherein said output circuit is an AB-class amplifier.

9. The operational amplifier of claim 1, wherein said first compensation circuit includes a capacitor.

10. The operational amplifier of claim 1, wherein said second compensation circuit includes a capacitor.

11. The operational amplifier of claim 1, wherein said third compensation circuit includes a capacitor.

12. The operational amplifier of claim 1, wherein said fourth compensation circuit includes a capacitor.

* * * * *